United States Patent
Kuwahara et al.

(10) Patent No.: US 7,342,265 B2
(45) Date of Patent: Mar. 11, 2008

(54) VERTICAL-TYPE SEMICONDUCTOR DEVICE HAVING REPETITIVE-PATTERN LAYER

(75) Inventors: Makoto Kuwahara, Nagoya (JP);
Yoshiyuki Hattori, Aichi-gun (JP);
Shoichi Yamauchi, Nagoya (JP);
Mikimasa Suzuki, Toyohashi (JP)

(73) Assignee: DENSO CORPORATION, Kariya (JP)

( * ) Notice: Subject to any disclaimer, the term of this patent is extended or adjusted under 35 U.S.C. 154(b) by 119 days.

(21) Appl. No.: 11/012,116

(22) Filed: Dec. 16, 2004

(65) Prior Publication Data

US 2005/0133859 A1    Jun. 23, 2005

(30) Foreign Application Priority Data

Dec. 22, 2003    (JP)    ............... 2003-424833

(51) Int. Cl.
*H01L 29/76*    (2006.01)
*H01L 29/94*    (2006.01)
*H01L 31/062*    (2006.01)
*H01L 31/113*    (2006.01)
*H01L 31/119*    (2006.01)

(52) U.S. Cl. .............. 257/288; 257/328; 257/331; 257/341

(58) Field of Classification Search .......... 257/288, 257/327–334
See application file for complete search history.

(56) References Cited

U.S. PATENT DOCUMENTS

| | | |
|---|---|---|
| 5,216,275 A | 6/1993 | Chen |
| 6,040,600 A | 3/2000 | Uenishi et al. |
| 6,337,498 B1 | 1/2002 | Hasegawa et al. |
| 6,406,982 B2 | 6/2002 | Urakami et al. |
| 6,512,268 B1 | 1/2003 | Ueno |
| 6,743,703 B2 | 6/2004 | Rodov et al. |
| 6,836,001 B2 | 12/2004 | Yamauchi et al. |
| 2001/0016369 A1 | 8/2001 | Zandman et al. |
| 2001/0028083 A1 | 10/2001 | Onishi et al. |

(Continued)

FOREIGN PATENT DOCUMENTS

JP    A-2000-260984    9/2000

(Continued)

OTHER PUBLICATIONS

Office Action issued from United States Patent Office issued on Feb. 10, 2006 for the corresponding U.S. Appl. No. 10/817,904.

(Continued)

*Primary Examiner*—Cuong Nguyen
(74) *Attorney, Agent, or Firm*—Posz Law Group, PLC (57) ABSTRACT

A semiconductor device is fabricated to include a withstand-voltage assurance layer designed into a multi-dimensional super junction structure and a group of trench gate electrodes, each of which penetrating a body layer in contact with the multi-dimensional super junction structure to reach the multi-dimensional super junction structure, so that dispersions of an on-resistance of the semiconductor device can be reduced. When a position at which the group of trench gate electrodes is created is shifted in one direction, the size of an overlap area common to the group of trench gate electrodes and an n-type column changes. However, the group of trench gate electrodes is oriented in such a way that the changes in overlap-area size are minimized.

2 Claims, 10 Drawing Sheets

U.S. PATENT DOCUMENTS

| | | |
|---|---|---|
| 2001/0032998 A1 | 10/2001 | Iwamoto et al. |
| 2002/0027237 A1* | 3/2002 | Onishi et al. ............... 257/262 |
| 2002/0074596 A1 | 6/2002 | Suzuki et al. |
| 2002/0088990 A1 | 7/2002 | Iwamoto et al. |
| 2003/0038342 A1 | 2/2003 | Standing |
| 2003/0219933 A1 | 11/2003 | Yamauchi et al. |
| 2004/0016959 A1 | 1/2004 | Yamaguchi et al. |
| 2004/0084724 A1 | 5/2004 | Kapels et al. |
| 2004/0235272 A1 | 11/2004 | Howard et al. ............ 438/462 |
| 2004/0238882 A1 | 12/2004 | Suzuki et al. |
| 2005/0006717 A1 | 1/2005 | Yamaguchi et al. |
| 2005/0045874 A1 | 3/2005 | Xiao et al. |
| 2005/0045996 A1 | 3/2005 | Yamauchi et al. |
| 2005/0077572 A1 | 4/2005 | Yamuchi et al. |
| 2005/0133859 A1 | 6/2005 | Kuwahara et al. |

FOREIGN PATENT DOCUMENTS

| | | |
|---|---|---|
| JP | A-2001-127289 | 5/2001 |
| JP | A-2003-209123 | 7/2003 |

OTHER PUBLICATIONS

Xing-Bi Chen, "Optimization of the Specific On-Resistance of the COOLMOS™", IEEE Transactions on Electron Devices, vol. 48, No. 2, pp. 344-349, Feb. 2001 (discussed on p. 2 in the specification).

Notice of Allowance issued from the U.S. Patent Office mailed on Jun. 15, 2007 for the related U.S. Appl. No. 10/817,904.

Office Action from U.S. Patent Office issued on Nov. 22, 2006 for the corresponding U.S. Appl. No. 10/817,904.

Office Actions from Chinese Patent Office issued on Oct. 13, 2006 and Apr. 13, 2007 for the corresponding Chinese patent application No. 2004100472390.

* cited by examiner

VERTICAL-TYPE SEMICONDUCTOR DEVICE HAVING REPETITIVE-PATTERN LAYER

CROSS REFERENCE TO RELATED APPLICATION

This application is based on and incorporates herein by reference Japanese Patent Application No. 2003-424833 filed on Dec. 22, 2003.

FIELD OF THE INVENTION

The present invention relates to a vertical-type semiconductor device having trench gate electrodes and a withstand-voltage assurance layer. More particularly, the present invention relates to a vertical-type semiconductor device having a withstand-voltage assurance layer of a super-junction structure.

BACKGROUND OF THE INVENTION

A vertical-type semiconductor device having trench gate electrodes and a withstand-voltage assurance layer is already known. The semiconductor device of this type has a characteristic exhibiting a high withstand voltage and a characteristic exhibiting small on-resistance or a low on-voltage. The on-resistance of the semiconductor device of this type can be considered to be the sum of a drift resistance and a channel resistance. The drift resistance is a resistance in a withstand-voltage assurance layer whereas the channel resistance is the resistance of a current path created along a trench gate electrode. In the conventional semiconductor device, there is a tradeoff that, when a characteristic exhibiting a high withstand voltage is implemented, the on-resistance increases in consequence. In this case, since a large portion of the on-resistance is a drift resistance, in order to improve the characteristic exhibiting a high withstand voltage and the characteristic exhibiting a small on-resistance or a low on-voltage, a technology for beating down this tradeoff is required.

As a technology for beating down this tradeoff, a technology for creating a withstand-voltage assurance layer in the so-called super junction structure has been developed. The super-junction structure is a structure in which p-type columns are arranged repetitively and alternatively with respect to n-type columns. By adoption of the super-junction structure, a depletion layer spread from each of repetitively created pn junction boundary faces completely depletes the withstand-voltage assurance layer, so that the concentration of impurities in the p-type columns and the n-type columns can be increased without losing the withstand-voltage characteristic. As a result, a characteristic exhibiting a high withstand voltage and a characteristic exhibiting a small on-resistance or a low on-voltage can be realized.

The following references, the contents of which are incorporated herein by reference, disclose that adoption of the super-junction structure makes it possible to implement a characteristic exhibiting a high withstand voltage and a characteristic exhibiting a small on-resistance or a low on-voltage.

Non-patent reference 1: Optimization of the Specific On-Resistance of COOLMOSTM, Xing-Bi-Chen and Johnny K. O. Sin, IEEE Transactions on Electron Devices, Vol. 48, No. 2, pp. 344-348, February, 2001.

Patent Reference 1: U.S. Pat. No. 5,216,275

The super-junction structure is known as a structure in which sheet p-type columns are arranged repetitively and alternatively with respect to sheet n-type columns. In the super-junction structure having such a configuration, regularity is repeated in one direction so that the super-junction structure can be called a one-dimensional super-junction structure.

On the other hand, another super-junction structure is also known as a structure in which p-type columns each having typically a square cross section are arranged repetitively and alternatively with respect to n-type columns each having typically a square cross section to form a cross-woven lattice. In the super-junction structure having such a configuration, regularity is repeated in two directions, so that the super-junction structure can be called a two-dimensional super-junction structure. A further super-junction structure is also known as a structure in which p-type columns each having typically a hexagonal cross section are arranged repetitively and n-type columns are placed in gaps between the p-type columns to form a honeybee nest shape. In the super-junction structure having such a configuration, regularity is repeated in three directions, so that the super-junction structure can be called a three-dimensional super-junction structure.

In a multi-dimensional super-junction structure, the ratio of the number of n-type columns to the number of p-type columns is higher than that in the one-dimensional super-junction structure. Thus, in a multi-dimensional super-junction structure, a low drift resistance can be implemented.

By adoption of a super-junction structure in a withstand-voltage assurance layer, the drift resistance can be reduced while a withstand voltage is being assured. In particular, by adoption of a multi-dimensional super-junction structure, the drift resistance can be much reduced. When the drift resistance is reduced by adoption of a multi-dimensional super-junction structure, the effect of the channel resistance on the on-resistance increases relatively. A technology for suppressing dispersions of a channel resistance or the channel resistance itself is of importance to a semiconductor device with the drift resistance reduced by adoption of a multi-dimensional super-junction structure. The channel resistance is determined by a relation between the position of a group of trench gate electrodes and the position of the multi-dimensional super junction.

For a pattern on the face of a multi-dimensional super junction structure, however, the position of a group of trench gate electrodes is difficult to adjust with a high degree of accuracy, so that dispersions of a channel resistance cannot be suppressed.

SUMMARY OF THE INVENTION

It is thus an object of the present invention to provide a semiconductor device having a multi-dimensional super junction structure and allowing dispersions of a channel resistance to be oppressed with ease in fabrication of the semiconductor device. It is another object of the present invention to provide a semiconductor device with a small channel resistance, or a design-aiding program which supports process of designing such a semiconductor device.

Inventors of the present invention have recognized that, in the case of a semiconductor device, which has a repetitive-pattern layer known as a multi-dimensional super-junction layer formed by creating second partial regions each having a second type of conduction, arranging the second partial regions repetitively in at least two directions on a face parallel to the principal face of the semiconductor device and filling gaps among the second partial regions with a first partial region having a first type of conduction, and has a group of trench gate electrodes each reaching the repetitive-pattern layer by penetrating a body layer in contact with the repetitive-pattern layer, the channel resistance is much affected by the size of an overlap area common to the group of trench gate electrodes and a partial region, which majority carriers flow through and is referred to in the following description as the first partial region.

Figure 14A:
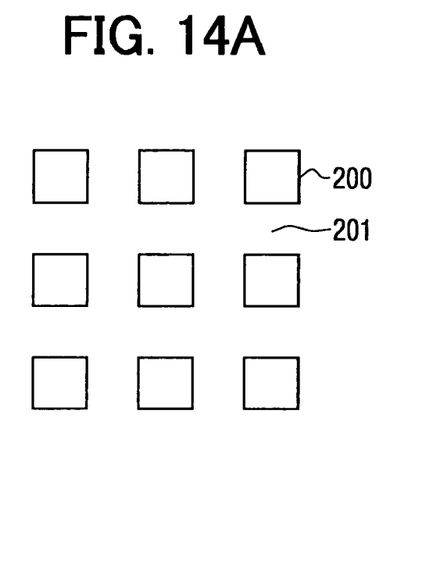
FIG. 14A is a diagram showing an on-face pattern of a super junction structure.
Figure 14B:
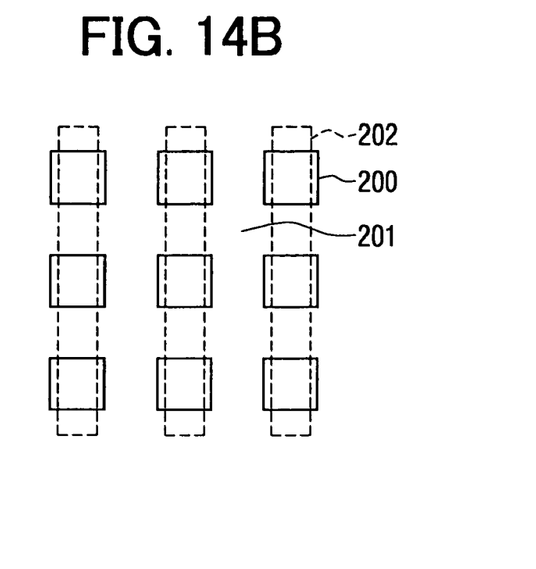
FIGS. 14B, 14C, and 14D are each a diagram showing a typical layout of trench gate electrodes.
Figure 14C:
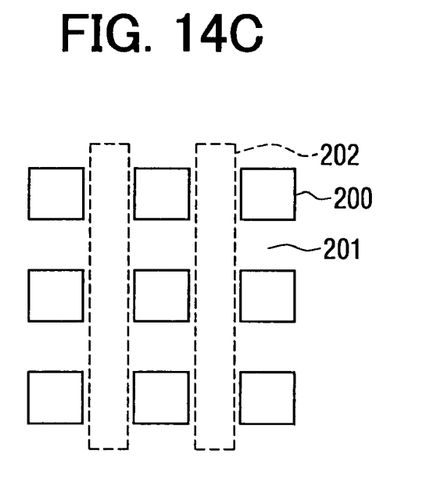
Figure 14D:
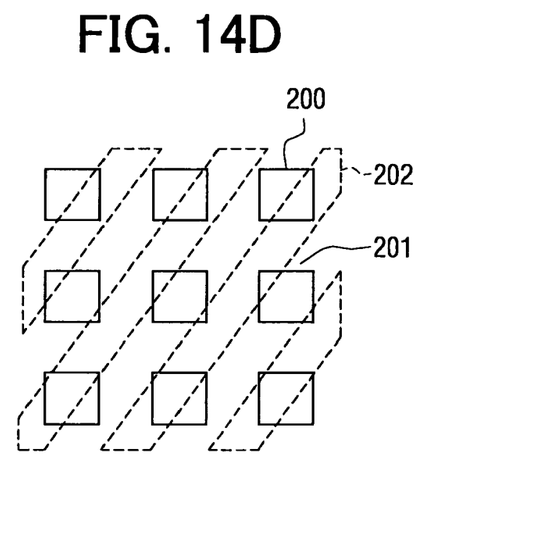

In the case of a configuration in which a group of trench gate electrodes extended over a long distance at least in one direction is used in conjunction with a multi-dimensional super junction structure, a change of the position of the trench gate electrode group relative to the multi-dimensional super junction structure also changes the size of the overlap area common to the trench gate electrode group and the first partial region. Assume for example that a super junction structure comprises second partial regions 200, each of which has a square cross section, and are laid out in a grid and are separated from each other by a first partial region 201 as shown in FIG. 14A. For such a super junction structure, a group of trench gate electrodes 202 can be created by extending each of trench gate electrodes 202 in parallel to the grid as shown in FIG. 14B or 14C. In the case of the configuration shown in FIG. 14B, the trench gate electrodes 202 are provided at locations coinciding with the second partial regions 200, so that the size of the overlap area common to the group of trench gate electrodes 202 and the first partial region 201 is small. In the case of the configuration shown in FIG. 14C, on the other hand, the trench gate electrodes 202 are each provided on a gap between two adjacent arrays of second partial regions 200 so that the size of the overlap area common to the group of trench gate electrodes 202 and the first partial region 201 is larger. In either case, when the group of trench gate electrodes 202 is shifted in a direction perpendicular to the longitudinal direction of the group of trench gate electrodes 202, the size of the overlap area is greatly changed. That is, dispersions of a quotient obtained as a result of dividing the difference between a maximum size and minimum size of the overlap area by the maximum size or dispersions of a ratio of the maximum size to the minimum size are large. In a configuration shown in FIG. 14D, on the other hand, each of trench gate electrodes 202 is arranged in a slanting direction with respect to the grid. In this configuration, even if the group of trench gate electrodes 202 is shifted in a direction perpendicular to the longitudinal direction of the group of trench gate electrodes 202, the size of the overlap area is not greatly changed. That is, dispersions of a ratio of the difference between a maximum size of the overlap area and a minimum size of the overlap area to the maximum size or dispersions of a ratio of the maximum size to the minimum size stay at a small value. It is to be noted that the group of trench gate electrodes 202 is shifted in the direction perpendicular to the longitudinal direction of the group of trench gate electrodes 202 forming parallel stripes in the group because the shifting direction is a uni-direction as will be described later. The uni-direction in which the group of trench gate electrodes 202 is shifted is considered to be the direction perpendicular to the longitudinal direction only for the reason of most simplicity and the statement of the uni-direction is no more than a statement made for the sake of convenience. In actuality, the uni-direction in which the group of trench gate electrodes 202 is shifted can be an inclined direction with respect to the longitudinal direction.

It is to be noted that, while FIGS. 14A to 14D are diagrams showing a very narrow portion, in actuality, regularity is prevalent in the horizontal and vertical directions.

In the case of a configuration in which a group of trench gate electrodes extended over a long distance at least in one direction is used in conjunction with a multi-dimensional super junction structure, the position of the group of trench gate electrodes relative to the multi-dimensional super junction structure is important. When the position of the group of trench gate electrodes relative to the multi-dimensional super junction structure is determined carelessly, the size of the overlap area common to the group of trench gate electrodes and the first partial region is greatly changed, so that the channel resistance and, hence, the on-resistance also greatly change as well when the group of trench gate electrodes is shifted. With such a configuration, semiconductor devices having stable characteristics cannot be fabricated at a high yield. In the case of a configuration in which the size of the overlap area common to the group of trench gate electrodes and the first partial region is not greatly changed, so that the channel resistance and, hence, the on-resistance also do not greatly change even if the group of trench gate electrodes is shifted, on the other hand, dispersions of the channel resistance are small.

As described above, the size of the overlap area common to the group of trench gate electrodes and the first partial region is greatly changed when the group of trench gate electrodes is shifted. With the size of the overlap area changing, the channel resistance reaches a maximum value for a minimum value of the size of the overlap area. Thus, by setting the group of trench gate electrodes at such a position relative to the multi-dimensional super junction structure in advance that the minimum value of the size of the overlap area increases, increases in channel resistance and, hence, increases in on-resistance can be suppressed. As a result, the channel resistance can be kept in a range of values not exceeding a predetermined upper limit.

By setting the group of trench gate electrodes at such a position relative to the multi-dimensional super junction structure in advance that the size of the overlap area becomes equal to a maximum value for a configuration in which the group of trench gate electrodes extended over a long distance at least in one direction is used in conjunction with a multi-dimensional super junction structure, the channel resistance can be reduced to a minimum value. Thus, a semiconductor device having a small channel resistance and, hence, a small on-resistance can be fabricated.

The inventors of the present invention were lead to novel origination of the present invention from the findings described above. It is to be noted that the scope of the semiconductor device provided by the present invention includes MOSFETs, IGBTs and thyristors. In each of the semiconductor devices, trench gate electrodes are created by extending the trench gate electrodes over a long distance at least in one direction on a face parallel to the principal face of the device and arranged repetitively in a direction perpendicular to the longitudinal of the electrodes. It is to be noted that the trench gate electrodes do not have to be extended straightly. For example, the trench gate electrodes can also be extended to form bumps or the like. As another alternative, every trench gate electrode can also be extended with its trench width changing in the longitudinal direction of the electrode. As a further alternative, the trench gate electrodes can be linked to each other.

The present invention also provides a design-aiding program for supporting a process of designing the semiconductor device.

The design-aiding program for supporting a process of designing the semiconductor device provided by the present invention is a program targeted at a semiconductor device having a multi-dimensional super junction structure, which includes a repetitive-pattern layer known as a multi-dimensional super-junction layer formed by creating second partial regions each having a second type of conduction, arranging the second partial regions repetitively in at least two directions on a face parallel to the principal face of the semiconductor device and filling gaps among the second partial regions with a first partial region having a first type of conduction, and includes a group of trench gate electrodes each reaching the repetitive-pattern layer by penetrating a body layer in contact with the repetitive-pattern layer. Majority carriers flow through the first partial region having a first type of conduction. It is to be noted that the trench gate electrodes at which the design-aiding program is targeted are created by extending the trench gate electrodes over a long distance at least in one direction on a face parallel to the principal face of the device and arranged repetitively in a direction perpendicular to the longitudinal of the electrodes. The trench gate electrodes do not have to be extended straightly. For example, the trench gate electrodes can also be extended to form bumps or the like. As another alternative, every trench gate electrode can also be extended with its trench width changing in the longitudinal direction of the electrode. As a further alternative, the trench gate electrodes can be linked to each other.

A first design-aiding program provided by the present invention is characterized in that the program is executed by a computer to carry out: processing to store data describing an on-face pattern of a first partial region on a repetitive-pattern layer; processing to assume a group of trench gate electrodes; processing to find a movement direction of the group of trench gate electrodes with respect to the on-face pattern of the first partial region; processing to compute a distance between the group of trench gate electrodes and the on-face pattern of the first partial region; processing to compute the size of an overlap area common to the group of trench gate electrodes and the on-face pattern of the first partial region; and processing to search for such a layout of the group of trench gate electrodes that, as a variation ratio varying due to the distance, a variation ratio of the computed size of the overlap area is reduced to a minimum.

By carrying out the pieces of processing described above, it is possible to search for such a relation between the position of the group of trench gate electrodes and the position of the repetitive layer that variations in channel resistance are minimized. Since the pieces of processing are carried out by execution of the program by a computer, the search processing can be performed with ease.

A second design-aiding program provided by the present invention is characterized in that the program is executed by a computer to carry out: processing to store data describing an on-face pattern of a first partial region on a repetitive-pattern layer; processing to assume a group of trench gate electrodes; processing to find a movement direction of the group of trench gate electrodes with respect to the on-face pattern of the first partial region; processing to compute a distance between the group of trench gate electrodes and the on-face pattern of the first partial region; processing to compute the size of an overlap area common to the group of trench gate electrodes and the on-face pattern of the first partial region; and processing to search for such a layout of the group of trench gate electrodes that, as a minimum value varying due to the distance, a minimum value of the computed size of the overlap area is increased to a maximum.

By carrying out the pieces of processing described above, it is possible to search for such a relation between the position of the group of trench gate electrodes and the position of the repetitive layer that a channel resistance is at least reduced to a range of values not exceeding a predetermined upper limit even if the position of a trench gate electrode is shifted. Since the pieces of processing are carried out by execution of the program by a computer, the search processing can be performed with ease.

A third design-aiding program provided by the present invention is characterized in that the program is executed by a computer to carry out: processing to store data describing an on-face pattern of a first partial region on a repetitive-pattern layer; processing to assume a group of trench gate electrodes; processing to find a movement direction of the group of trench gate electrodes with respect to the on-face pattern of the first partial region; processing to compute a distance between the group of trench gate electrodes and the on-face pattern of the first partial region; processing to compute the size of an overlap area common to the group of trench gate electrodes and the on-face pattern of the first partial region; and processing to search for such a layout of the group of trench gate electrodes that the computed size of the overlap area becomes equal to a maximum value.

By carrying out the pieces of processing described above, it is possible to search for such a relation between the position of the group of trench gate electrodes and the position of the repetitive layer that a channel resistance is minimized. Since the pieces of processing are carried out by execution of the program by a computer, the search processing can be performed with ease.

For creation of the new semiconductor device, the inventors of the present invention have also thought of a method for fabricating the new semiconductor device.

The method for fabricating the new semiconductor device in accordance with the present invention is a semiconductor-device fabrication method for creating a repetitive-pattern layer on a semiconductor substrate having a cutout face. The method for fabricating the new semiconductor device includes a stage of creating the repetitive-pattern layer on the semiconductor substrate on the basis of a layout found by execution of the first or second design-aiding program as the layout of the group of trench gate electrodes in such a way that the movement direction of the layout is parallel to the cutout face of the substrate.

In accordance with the method for fabricating the new semiconductor device, when the first design-aiding program is used in a combination of the repetitive-pattern layer and the group of trench gate electrodes, a movement direction most reducing a variation ratio of a computed size of the overlap area is a direction parallel to the cutout face of the semiconductor substrate. When the second design-aiding program is used, on the other hand, a movement direction parallel to the cutout face of the semiconductor substrate is a direction most increasing a minimum value of a computed size of the overlap area. In general, in a process to create the group of trench gate electrodes on a semiconductor substrate, the position of the group is most likely shifted in a direction parallel to the cutout face of the semiconductor substrate. Thus, when the repetitive-pattern layer is created on the semiconductor substrate by execution of the first design-aiding program in the positional relationship cited above, a semiconductor device having a small variation ratio is easy to fabricate even if the position of the group of trench gate electrodes is shifted. When the repetitive-pattern layer is created on the semiconductor substrate by execution of the second design-aiding program, on the other hand, a channel resistance is at least reduced to a range of values not exceeding a predetermined upper limit even if the position of a trench gate electrode is shifted.

The semiconductor device provided by the present invention is a semiconductor device having a multi-dimensional super junction structure. In accordance with the present invention, a semiconductor device having small dispersions of a channel resistance can be fabricated even if the position of a group of trench gate electrodes is shifted. In addition, a semiconductor device having a channel resistance smaller than a predetermined value can also be fabricated. Furthermore, a semiconductor device having a channel resistance reduced to a minimum value can also be fabricated.

DESCRIPTION OF THE PREFERRED EMBODIMENTS

The present disclosure a semiconductor device that comprises: a pair of main electrodes; a source region having a first type of conduction, connected to one of the pair of main electrodes; a body layer having a second type of conduction, which surrounds the source region having the first type of conduction, is connected to one of the main electrodes; a withstand-voltage assurance layer separated from the source region by the body layer; and a group of trench gate electrodes facing the body layer through a gate insulation film. The withstand-voltage assurance layer has a repetitive-pattern area in which first partial regions each having a first type conduction and each extended in a direction connecting the main electrodes of the main-electrode pair to each other and second partial regions each having a second type of conduction, and each extended in the direction connecting the main electrodes are created repetitively and alternatively in at least two directions on a face perpendicular to the direction connecting the main electrodes. The group of trench gate electrodes extend over a long distance on a face parallel to the principal face of the semiconductor device and are arranged repetitively in a direction perpendicular to the longitudinal of the group. The longitudinal direction is set to be coincident with a direction minimizing a variation ratio of an overlap area resulting from a one-directional change of a distance between the group of trench gate electrodes and a reference point in the first partial direction as an overlap area common to the trench gate electrode group and the first partial region where the variation ratio is defined typically as a quotient obtained as a result of dividing a difference between the maximum size and minimum size of the overlap area by the maximum size.

Embodiments of the present invention are explained in detail by referring to diagrams as follows. First and second embodiments are provided to conduct a study for p-type and n-type columns of a withstand-voltage assurance layer as a study of a distance over which a trench gate electrode is shifted when the inclination angle of the longitudinal direction of the trench gate electrode is changed and a study of an area (overlap area) of a top face pertaining to an n-type column as a top face facing the bottom face of the n-type column. It is to be noted that the shape of every trench gate electrode in each embodiment does not change along the longitudinal direction of the electrode. Thus, even if the group of trench gate electrodes is shifted in any direction, a positional shift of a directional component in the longitudinal direction can be ignored. For this reason, in the embodiments, only a positional shift in a direction perpendicular to the longitudinal direction is studied. In effect, shifts in all directions are studied.

First Embodiment

Figure 1:
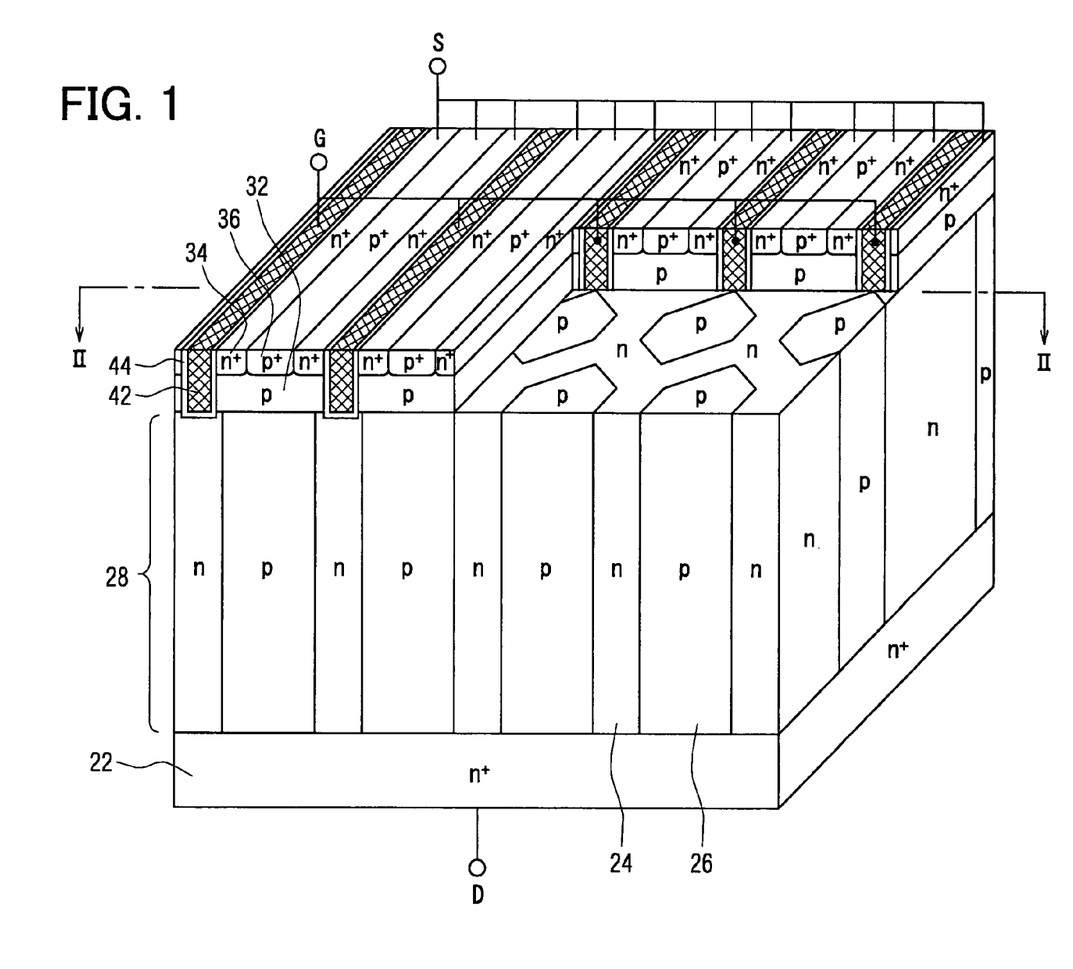
FIG. 1 is a diagram showing a perspective view of elements composing a semiconductor device implemented by a first embodiment.

FIG. 1 is a diagram showing a perspective view of elements composing a semiconductor device including a repetitive-pattern structure of p-type columns 26 and n-type columns 24 on a withstand-voltage layer 28. The semiconductor device has a group of trench gate electrodes 42 each reaching a withstand-voltage layer 28 by penetrating a body layer 32 in contact with the withstand-voltage layer 28. The trench gate electrodes 42 are each created by extending the trench gate electrodes 42 straightly over a long distance on a face parallel to the principal face of the semiconductor device and are arranged repetitively in a direction perpendicular to the longitudinal direction of the group of trench gate electrodes 42 to form parallel stripes. A portion of the body layer 32 is cut out to expose an on-face pattern of the repetitive-pattern structure.

The semiconductor device shown in FIG. 1 is explained in more detail as follows. The repetitive-pattern structure of the semiconductor device includes a pair of main electrodes, an n$^+$ type source region 34, a p-type body layer 32, the withstand-voltage assurance layer 28 and the trench gate electrode 42. In this typical configuration, the main electrodes are a drain electrode D and a source electrode S. The n$^+$ type source region 34 is connected to the source electrode S. The body layer 32 surrounds the n$^+$ type source region 34 and is connected to the source electrode S through a p$^+$ type body contact region 36. The withstand-voltage assurance layer 28 is in contact with the body layer 32 and separated from the n$^+$ type source region 34 by the body layer 32. The trench gate electrode 42 faces the body layer 32, which separates the n$^+$ type source region 34 and the withstand-voltage assurance layer 28 from each other, through a gate insulation layer 44.

The withstand-voltage assurance layer 28 comprises p-type columns 26 and n-type columns 24. The p-type columns 26 and the n-type columns 24 are extended in a direction connecting the main electrodes of the main-electrode pair to each other. The direction connecting the main electrodes of the main-electrode pair to each other is a vertical direction in the drawing of FIG. 1. The p-type columns 26 and the n-type columns 24 are arranged repetitively and alternatively on a face perpendicular to the direction, which connects the main electrodes of the main-electrode pair to each other, at least in two directions. The p-type columns 26 and the n-type columns 24 can also be arranged repetitively and alternatively on a face parallel to the principal face of the semiconductor device at least in two directions.

On the rear face of the withstand-voltage assurance layer 28, an n$^+$ type drain region 22 is created. The n$^+$ type drain region 22 is connected to the drain electrode D.

Figure 2:
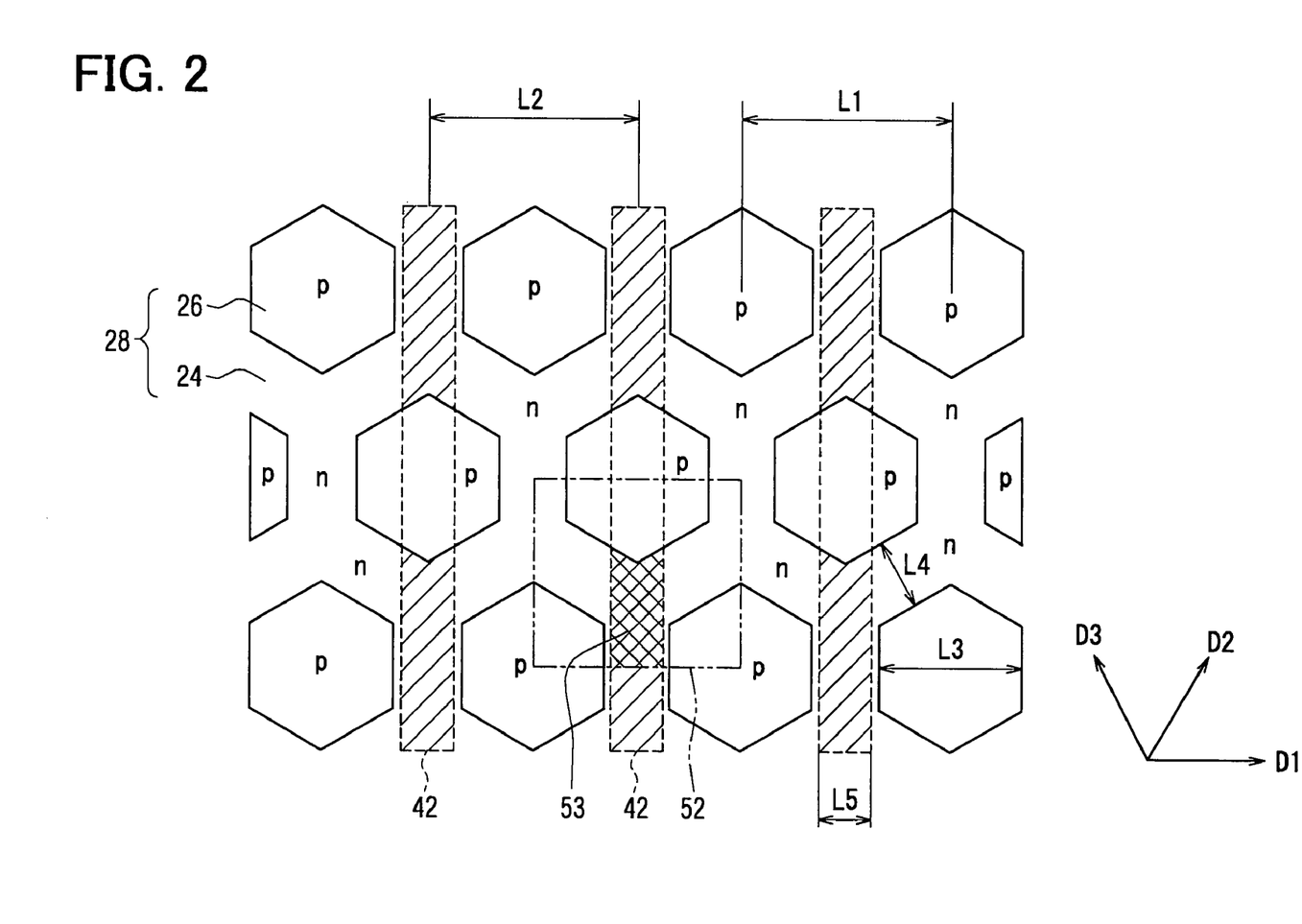
FIG. 2 is a diagram showing a relation between positions of trench gate electrodes and positions of a withstand-voltage assurance layer in a reference layout of the semiconductor device implemented by the first embodiment.

FIG. 2 is a diagram showing a cross section indicated by arrows 11 in FIG. 1. FIG. 2 shows a portion of an on-face pattern of the p-type columns 26 and the n-type columns 24, which are arranged repetitively and alternatively on a face perpendicular to the direction connecting the main electrodes of the main-electrode pair to each other. The p-type columns 26 each having a hexagonal cross section are arranged periodically among the n-type columns 24, being distributed in a layout exhibiting regularity. A distance L1 between the gravity points of any adjacent p-type columns 26 is fixed for all the p-type columns 26. A distance L3 between two sides of a p-type column 26, which face each other, is 3 microns. A distance L4 between two adjacent p-type columns 26 is 1 micron. The p-type columns 26 are arranged repetitively in three directions separated from each other by 60 degrees similarly to directions D1, D2, and D3 shown in the figure.

A hatched area 42 enclosed by a dashed line shown in FIG. 2 corresponds to the position of each trench gate electrode 42 in the layout. The trench width L5 of each trench gate electrode 42 is 0.8 microns. The trench width is fixed in the longitudinal direction of the trench gate electrode 42. Areas in which the trench gate electrodes 42 and the n-type columns 24 overlap each other are each indicated by a hatched portion 53. The longitudinal direction of the trench gate electrodes 42 is parallel to one side of the hexagonal cross section of every p-type column 26. In the first embodiment, a positional relationship between the positions of the trench gate electrodes 42, the n-type columns 24, and the p-type columns 26 shown in FIG. 2 is taken as a reference positional relationship with an inclination angle of 0 degrees. The inclination angle is an angle formed by the longitudinal direction of the trench gate electrodes 42 and a direction perpendicular to the aforementioned distance L1. An inter-trench pitch L2 between adjacent trench gate electrodes 42 is equal to the distance L1 between the gravity points of any adjacent p-type columns 26. With the trench gate electrodes 42 arranged at the inter-trench pitch L2, when the positions of the trench gate electrodes 42 are shifted, the positions of the overlaps areas common to the trench gate electrodes 42 and the n-type columns 24 also move similarly to the movement of the trench gate electrodes 42.

An area 52 enclosed by a dashed line shown in FIG. 2 represents a typical basic configuration of the on-face pattern element comprising an n-type column 24 and p-type columns 26. A plane pattern shown in FIG. 2 can be considered as a repetitive pattern obtained by arranging the basic configuration 52 repetitively. Thus, with the positions of the trench gate electrodes 42 shifted, a change of an overlap area common to the trench gate electrode 42 and the n-type column 24 in the basic configuration 52 can be considered to be a representative of a change of overlaps areas common to the group of all trench gate electrodes 42 and the n-type column 24 in the plane pattern shown in FIG. 2. In the example shown in FIG. 2, the overlap area in the basic configuration 52 is the hatched portion 53 cited above.

Figure 3:
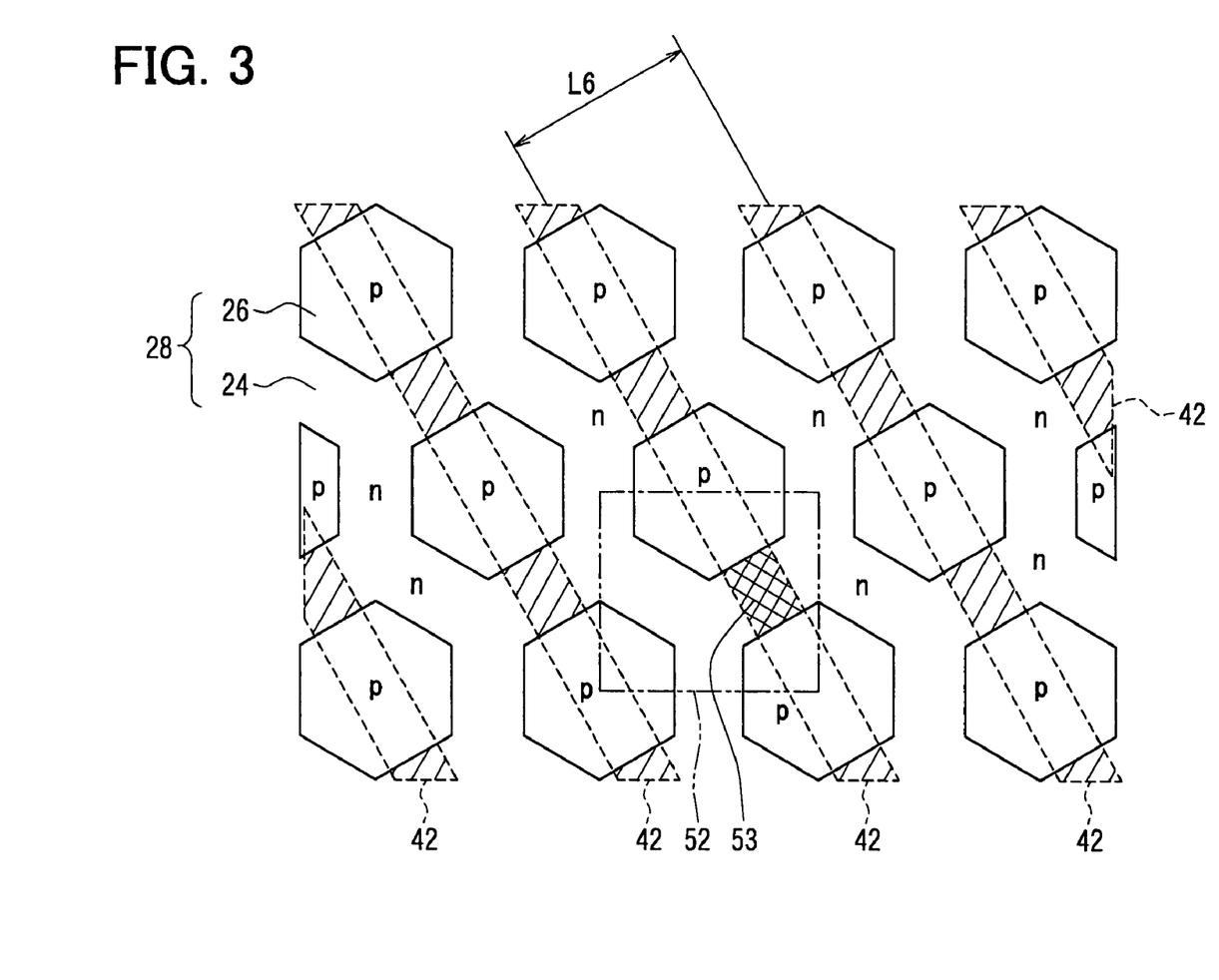
FIG. 3 is a diagram showing a relation between positions of the trench gate electrodes and positions of the withstand-voltage assurance layer at an inclination angle of 30 degrees in the semiconductor device implemented by the first embodiment.

FIG. 3 is a diagram showing a positional relationship obtained by inclining trench gate electrodes 42 from the reference layout shown in FIG. 2 by a rotation angle of 30 degrees in the left direction in the figure as a relation between the positions of the trench gate electrodes 42, the n-type columns 24, and the p-type columns 26. In the positional relationship shown in FIG. 3, an inter-trench pitch L6 between adjacent trench gate electrodes 42 is different from the distance L1 between the gravity points of any adjacent p-type columns 26. When the adjacent trench gate electrodes 42 are rotated in the counterclockwise direction as shown in FIG. 3, the size of the overlap area common to each of the adjacent trench gate electrodes 42 and the n-type column 24 also changes at the same period as the rotation angle of the adjacent trench gate electrode 42. In order for the size of the overlaps areas common to all the adjacent trench gate electrodes 42 and the n-type column 24 to change at a uniform period equal to the period of the rotation angle, the adjacent trench gate electrodes 42 each need to be rotated in such a way that the inter-trench pitch L6 between adjacent trench gate electrodes 42 is equal to a product obtained as a result of multiplying the distance L1 between the gravity points of any adjacent p-type columns 26 by cos ($\pi/6$) where $\pi/6$ is the aforementioned rotation angle of 30 degrees. That is, L6=L1 * cos ($\pi/6$).

Figure 4:
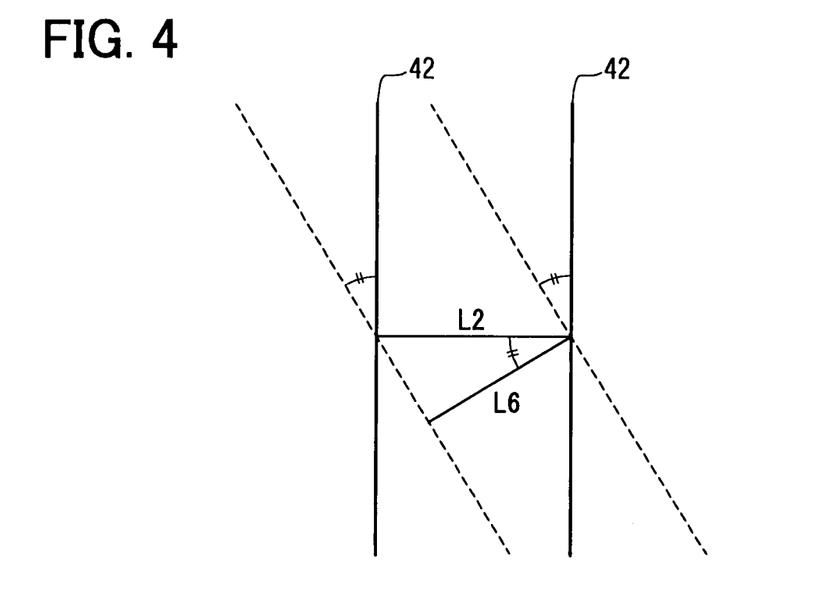
FIG. 4 is a diagram showing a model of a relation between inclination angles of the trench gate electrodes and inter-trench pitches.

The above rationale is explained by referring to FIG. 4 as follows. Let solid lines shown in the figure represent the layout orientation of the trench gate electrode 42 in the reference layout and dashed lines represent the layout orientation of the trench gate electrode 42 at the inclined position. As is obvious from FIG. 4, the relation between the inter-trench pitch L2 in the reference layout and the inter-trench pitch L6 at the inclined position is the relation between the hypotenuse and base of a right triangle. Assume that the inclination angle is θ. In this case, the inter-trench pitch L6 at the inclined position is equal to a product obtained as a result of multiplying the inter-trench pitch L2 in the reference layout by cos θ. That is, L6=L2* cos ($\pi/6$). It is to be noted that the trench gate electrodes 42 can also be arranged at intervals equal to an integral multiple of the inter-trench pitch L6 at the inclined position. In either case, the size of the overlap area common to each of the adjacent trench gate electrodes 42 and the n-type column 24 changes at the same period as the rotation angle θ of the adjacent trench gate electrode 42. When the trench gate electrodes 42 are laid out to give the positional relationship described above, effects to be described later can be obtained.

Figure 5:
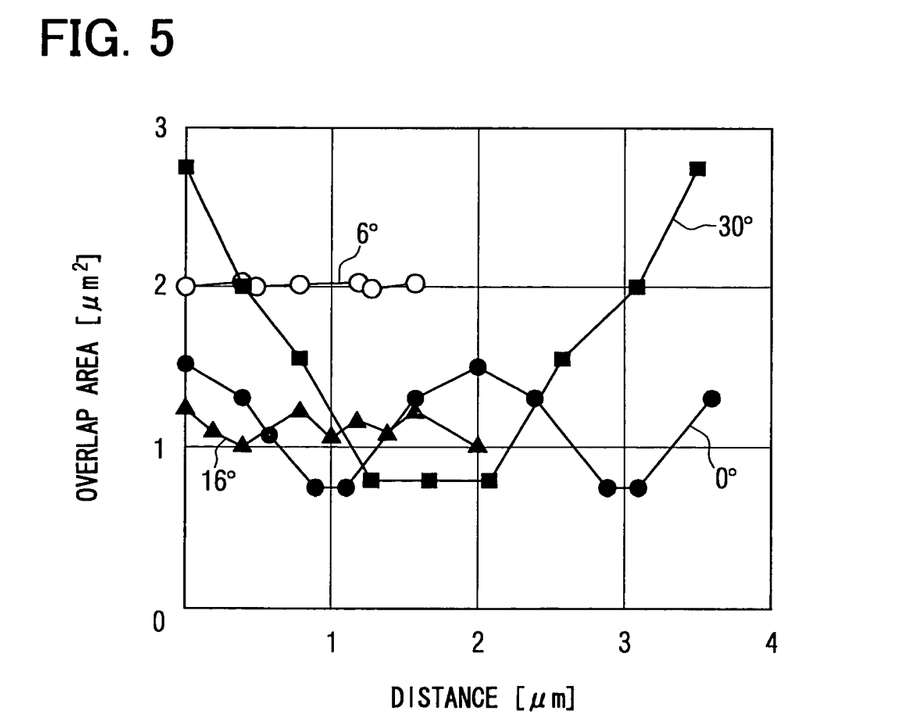
FIG. 5 is a diagram showing relations between movement distances of the trench gate electrodes and sizes of an overlap area for the first embodiment.

FIG. 5 is a diagram showing plotted relations between the size of the overlap area common to the trench gate electrode 42 and the n-type column 24 versus the distance of a shift of the trench gate electrode 42 from the reference layout in the D1 direction in the basic configuration 52. The plotted relations represent the sizes of the overlap area common to the trench gate electrode 42 and the n-type column 24 for different distances of a shift of the trench gate electrode 42 from the reference layout in the D1 direction at inclination angles of 0, 6, 16, and 30 degrees. The inclination angles are angles by which the trench gate electrode 42 is rotated in the counterclockwise direction from the reference layout corresponding to the inclination angle of 0 degrees. The horizontal axis represents the distance of a shift of the trench gate electrode 42 from the reference layout in the D1 direction and the vertical axis represents the size of the overlap area common to the trench gate electrode 42 and the n-type column 24. It is to be noted that the inclination angles of 0, 6,16, and 30 degrees shown in FIG. 5 correspond to the relations for the respective inclination angles. It is also to be noted that, considering the fact that the shape of the cross section of every p-type column 26 is hexagonal, all relative relations between the positions of the trench gate electrode 42 and the n-type column 24 are included as far as the inclination angle is in the range 0 to 30 degrees.

As is obvious from the relations shown in FIG. 5, with the trench gate electrode 42 rotated through an inclination angle, the change of the size of the overlap area common to the trench gate electrode 42 and the n-type column 24 greatly varies in dependence on the inclination angle. Thus, the relative relation between the positions of the trench gate electrode 42 and the n-type column 24 is of importance to suppression of dispersions of the channel resistance or the like.

Figure 6:
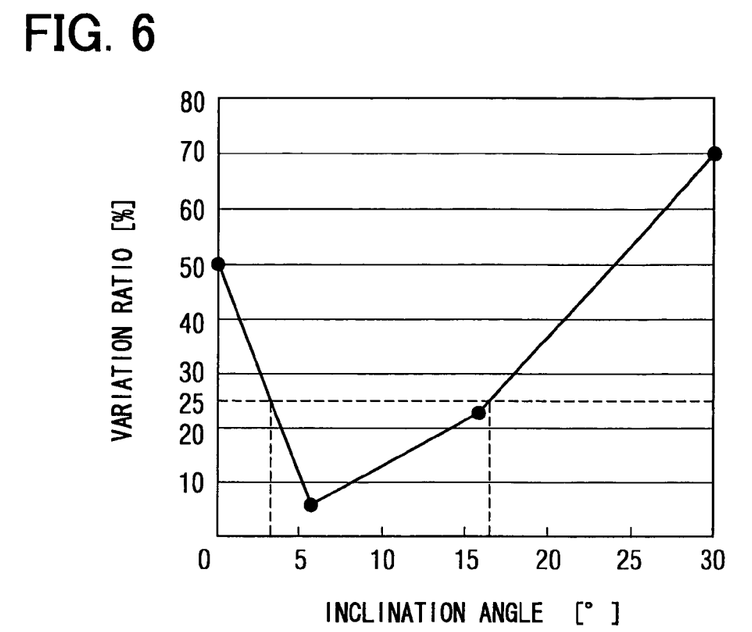
FIG. 6 is a diagram showing a relation between inclination angles of the trench gate electrodes and variation ratios at the inclination angles for the first embodiment.

FIG. 6 is a diagram showing a relation between the inclination angle of the trench gate electrode 42 versus the variation ratio of the size of the overlap area common to the trench gate electrode 42 and the n-type column 24. In the diagram, the horizontal axis represents the inclination angle whereas the vertical axis represents the variation ratio.

It is to be noted that the variation ratio of the size of the overlap area common to the trench gate electrode 42 and the n-type column 24 is expressed by using the following equation:

Overlap-area variation ratio=(Smax−Smin)/Smax×100 [%] where notation Smax denotes a maximum size of overlap areas common to the trench gate electrode 42 and the n-type column 24 with the trench gate electrode 42 moved in the D1 direction whereas notation 5 min denotes a minimum size of overlap areas common to the trench gate electrode 42 and the n-type column 24 with the trench gate electrode 42 moved in the D1 direction. That is, the smaller the variation ratio, the smaller the variation caused by the movement of the trench gate electrode 42 in the D1 direction as the variation of the size of the overlap area common to the trench gate electrode 42 and the n-type column 24. A small variation ratio also indicates that a change in channel resistance is also small.

In this embodiment, the variation ratio of the size of the overlap area becomes a minimum for a 6-degree inclination angle of the trench gate electrode 42. Thus, it is desirable to set the trench gate electrode 42 at about a position corresponding to the inclination angle of 6 degrees. It is to be noted that, when the upper limit of the variation ratio of the channel resistance is set at 25%, a 25% upper limit of the variation ratio of the size of the overlap area corresponds to the inclination-angle range 4 to 16 degrees in the relation shown in FIG. 6. Thus, by setting the trench gate electrodes at an inclination angle in the range of 4 to 16 degrees, semiconductor devices having channel-resistance dispersions within a practical range of tolerance as dispersions for the shifted positions of the trench gate electrodes can be fabricated at a high yield.

It is to be noted that the following description explains the reason why the channel-resistance variation ratio not larger than 25% results in dispersions of the channel resistance within the practical range of tolerance. When the withstand-voltage assurance layer of the semiconductor devices has a repetitive area in which p-type columns are extended in a direction connecting the main electrodes of the main-electrode pair to each other, n-type columns are also extended in the direction connecting the main electrodes and the p-type columns are arranged repetitively and alternatively with respect to the n-type columns at least in two directions on a face perpendicular to the direction connecting the main electrodes, the channel resistance occupies about ⅕ of the on-resistance of the semiconductor device. Thus, when the variation ratio of the channel resistance is set at a value not larger than an upper limit of 25%, the variation ratio of the on-resistance will not be larger than 5%, which is the upper limit of the practical range of tolerance.

Figure 7:
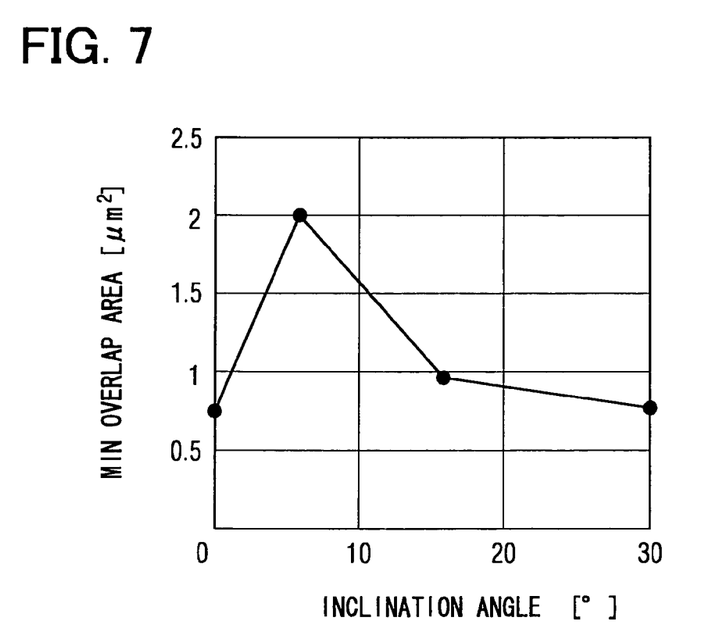
FIG. 7 is a diagram showing a relation between inclination angles of the trench gate electrodes and minimum values of the size of the overlap area at the inclination angles for the first embodiment.

FIG. 7 is a diagram showing a relation between the inclination angle of the trench gate electrode 42 and 5 min shown in FIG. 5 as the minimum size of overlaps areas common to the trench gate electrode 42 and the n-type column 24. In the diagram, the horizontal axis represents the inclination angle whereas the vertical axis represents 5 min.

As is obvious from the relation shown in FIG. 7, the minimum size of overlaps areas common to the trench gate electrode 42 and the n-type column 24 reaches a maximum value when the inclination angle of the trench gate electrode 42 is set at 6 degrees. Thus, by setting the trench gate electrode 42 at an inclination angle of about 6 degrees, the size of the overlap area that can be at least allocated is greater than that for other inclination angles even if the trench gate electrode 42 is shifted from the inclination angle of 6 degrees. As a result, an increase in channel resistance can be suppressed. Accordingly, the channel resistance can be kept in a range of values not exceeding a predetermined upper limit.

It is to be noted that, in the case of the first embodiment, an inclination angle with a small variation ratio of the size of the overlap area and an inclination angle with a minimum size of the overlap area are both an angle in close proximity to the inclination angle of 6 degrees. Thus, in the case of the first embodiment, by setting the trench gate electrode 42 at the inclination angle of about 6 degrees, it is possible to easily implement a layout position of the trench gate electrode 42 as a layout position providing both a small variation ratio of the channel resistance and a channel resistance in a range of values not exceeding a predetermined upper limit.

In addition, the relations shown in FIG. 5 also indicate that, at an inclination angle of 30 degrees and a shift distance of 0 microns, the size of the overlap area reaches a maximum value. Thus, in the case of the first embodiment, by setting the group of trench gate electrodes at an inclination angle of 30 degrees and a shift distance of 0 microns, the channel resistance can be reduced to a minimum value.

Second Embodiment

Figure 8:
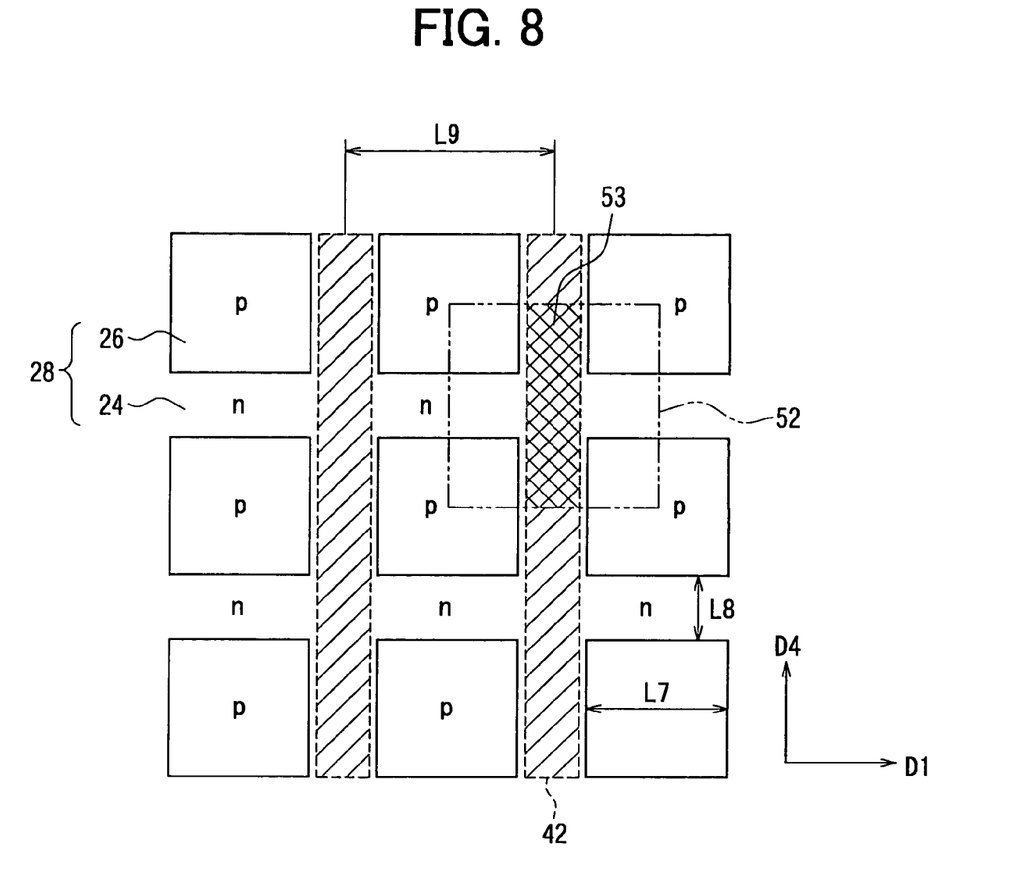
FIG. 8 is a diagram showing a relation between positions of trench gate electrodes and positions of a withstand-voltage assurance layer in a reference layout of a semiconductor device implemented by a second embodiment.

FIG. 8 is a diagram showing an on-face pattern of p-type columns 26 and n-type columns 24. In the on-face pattern comprising the p-type columns 26 and the n-type columns 24 in accordance with a second embodiment, the p-type columns 26 each having a square cross section are arranged periodically among the n-type columns 24, being distributed in a layout exhibiting regularity. A distance between the gravity points of any adjacent p-type columns 26 is fixed for all the p-type columns 26. A distance L7 between two sides of a p-type column 26, which face each other, is 3 microns. A distance L8 between two adjacent p-type columns 26 is 1 micron. The p-type columns 26 are arranged repetitively on a face perpendicular to a line connecting main electrodes of a main-electrode pair in two directions like directions D1 and D4 shown in the figure.

A hatched area 42 enclosed by a dashed line shown in FIG. 8 corresponds to the position of each trench gate electrode 42 in the layout. The trench width of each trench gate electrode 42 is 0.8 micron. Areas in which the trench gate electrodes 42 and the n-type columns 24 overlap each other are each indicated by a hatched portion 53. The longitudinal direction of the trench gate electrodes 42 is parallel to one side of the square cross section of every p-type column 26. In the second embodiment, a positional relationship shown in FIG. 8 as a relation between the positions of the trench gate electrodes 42 and the in-face pattern is taken as a reference positional relationship with an inclination angle of 0 degrees. An inter-trench pitch L9 between adjacent trench gate electrodes 42 is equal to the distance between the gravity points of any adjacent p-type columns 26. With the trench gate electrodes 42 arranged at the inter-trench pitch L9, when the positions of the trench gate electrodes 42 are shifted, the positions of the overlaps areas common to the trench gate electrodes 42 and the n-type columns 24 also move periodically at the same period as the trench gate electrodes 42 are rotated.

Figure 9:
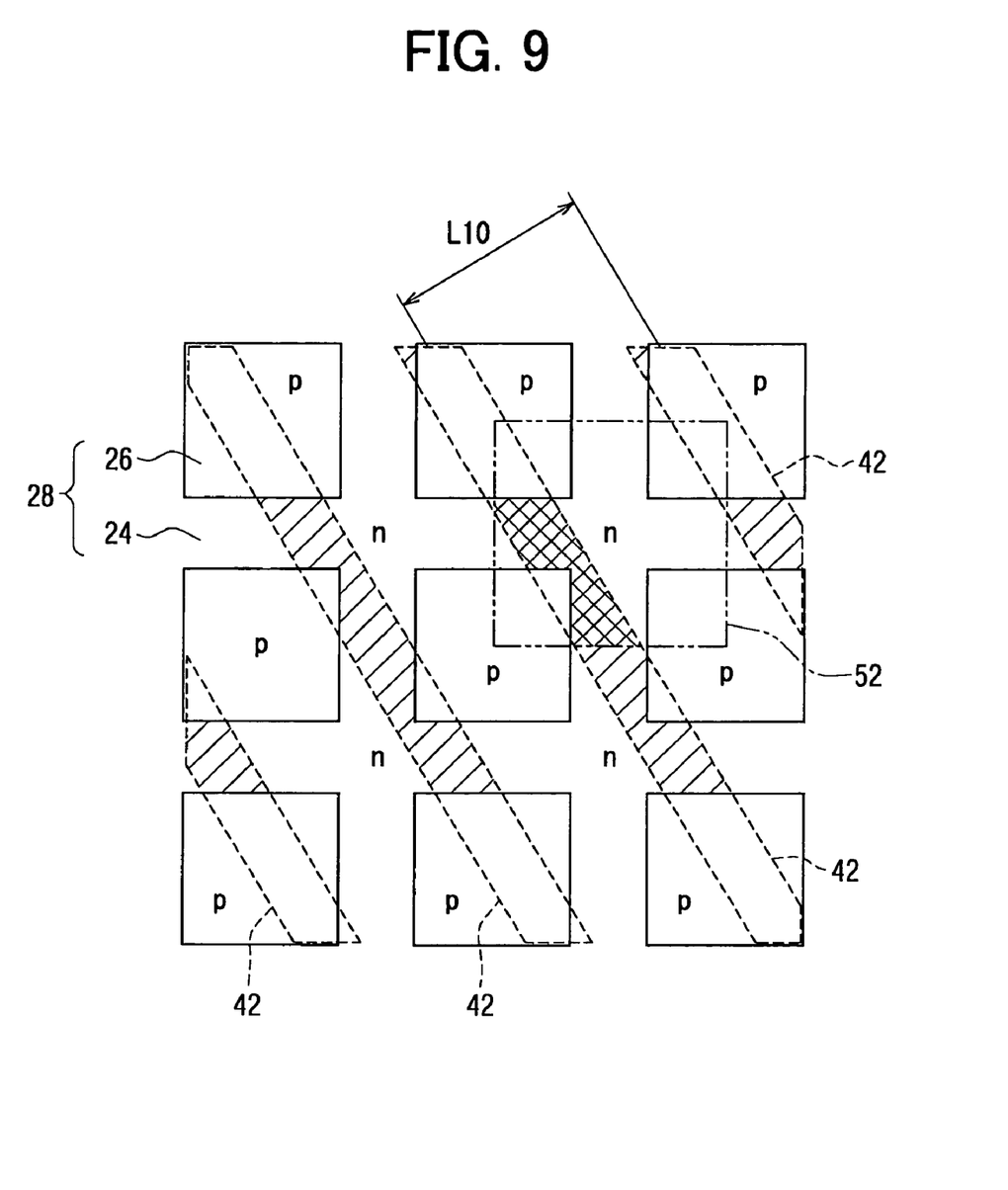
FIG. 9 is a diagram showing a relation between positions of the trench gate electrodes and positions of the withstand-voltage assurance layer at an inclination angle of 45 degrees in the semiconductor device implemented by the second embodiment.

FIG. 9 is a diagram showing a positional relationship obtained by inclining trench gate electrodes 42 from the reference layout by a rotation angle of 45 degrees in the left direction in the figure as a relation between the positions of the trench gate electrodes 42, the n-type columns 24 and the p-type columns 26. In the positional relationship shown in FIG. 9, the inter-trench pitch L10 between adjacent trench gate electrodes 42 is equal to a product obtained as a result of multiplying the distance between the gravity points of any adjacent p-type columns 26 by cos (π/4). That is, L6=L9 * cos (π/4).

Figure 10:
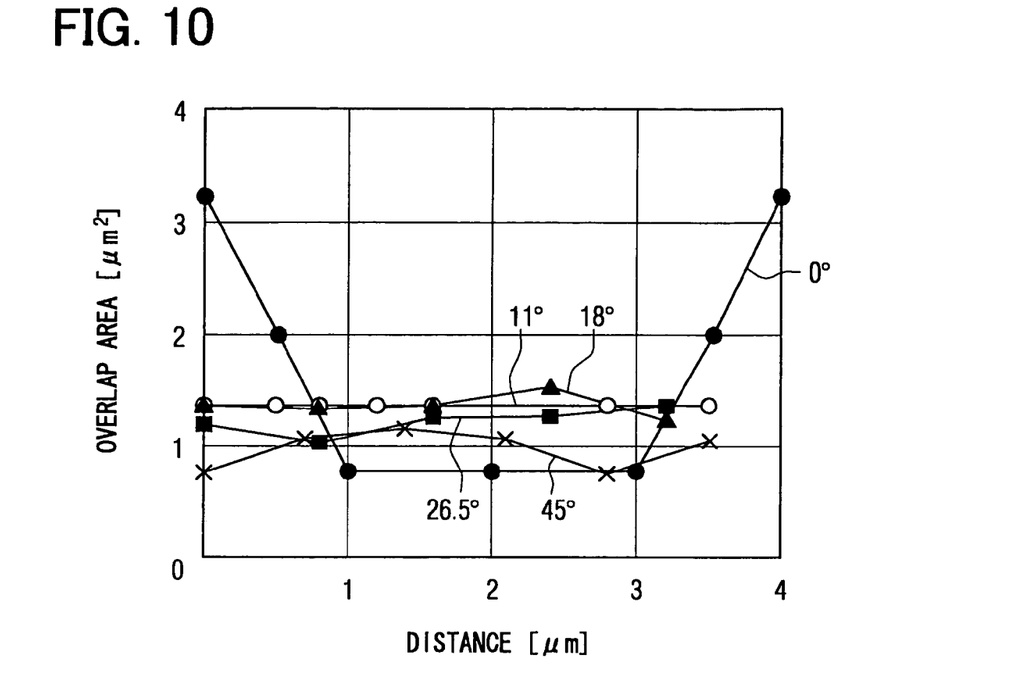
FIG. 10 is a diagram showing relations between movement distances of the trench gate electrodes and sizes of an overlap area for the second embodiment.

FIG. 10 is a diagram showing plotted relations between the size of the overlap area common to the trench gate electrode 42 and the n-type column 24 versus the distance of a shift of the trench gate electrode 42 from the reference layout in the D1 direction. The plotted relations represent the sizes of the overlap area common to the trench gate electrode 42 and the n-type column 24 for different distances of a shift of the trench gate electrode 42 from the reference layout in the D1 direction at inclination angles of 0, 11, 18, 26.5, and 45 degrees. The inclination angles are angles by which the trench gate electrode 42 is rotated in the counterclockwise direction from the reference layout corresponding to the inclination angle of 0 degrees. The horizontal axis represents the distance of a shift of the trench gate electrode 42 from the reference layout in the D1 direction and the vertical axis represents the size of the overlap area common to the trench gate electrode 42 and the n-type column 24. It is to be noted that the inclination angles of 0, 11, 18, 26.5, and 45 degrees shown in FIG. 10 correspond to the relations for the respective inclination angles. It is also worth noting that, considering the fact that the shape of the cross section of every p-type column 26 is square, all relative relations between the positions of the trench gate electrode 42, the n-type column 24, and the p-type column 26 are included as far as the inclination angle is in the range 0 to 45 degrees.

As is obvious from the relations shown in FIG. 10, with the trench gate electrode 42 rotated through an inclination angle in the D1 direction, the change of the size of the overlap area common to the trench gate electrode 42 and the n-type column 24 greatly varies in dependence on the inclination angle.

Figure 11:
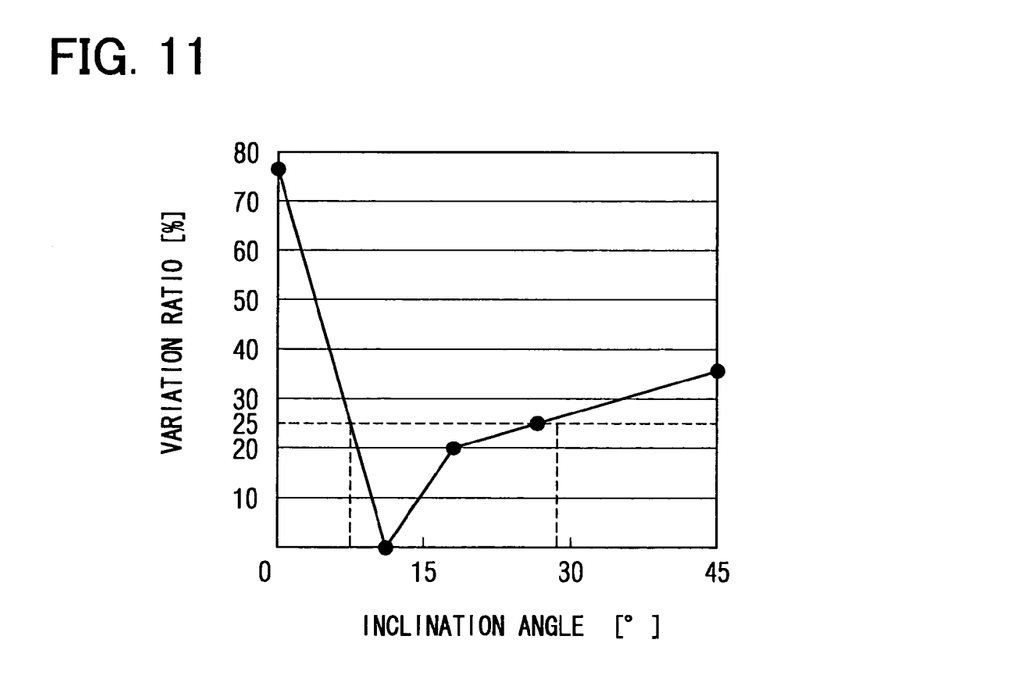
FIG. 11 is a diagram showing a relation between inclination angles of the trench gate electrodes and variation ratios at the inclination angles for the second embodiment.

FIG. 11 is a diagram showing a relation between the inclination angle of the trench gate electrode 42 versus the variation ratio of the size of the overlap area common to the trench gate electrode 42 and the n-type column 24. In the diagram, the horizontal axis represents the inclination angle whereas the vertical axis represents the variation ratio.

In the case of the second embodiment, the variation ratio of the size of the overlap area becomes a minimum for an 11-degree inclination angle of the trench gate electrode 42. Thus, it is desirable to set the trench gate electrode 42 at about a position corresponding to the inclination angle of 11 degrees. In this case, since the variation ratio of the size of the overlap area is small, variations in channel resistance are small even if the position of the trench gate electrode 42 is shifted. It is to be noted that, when the upper limit of the variation ratio of the channel resistance is set at 25%, a 25% upper limit of the variation ratio of the size of the overlap area corresponds to the inclination-angle range 8 to 29 degrees in the relation shown in FIG. 11 in the case of the second embodiment. Thus, by setting the trench gate electrodes at an inclination angle in the range 8 to 29 degrees, semiconductor devices having channel-resistance dispersions within a practical range of tolerance for the shifted positions of the trench gate electrodes can be fabricated at a high yield.

Figure 12:
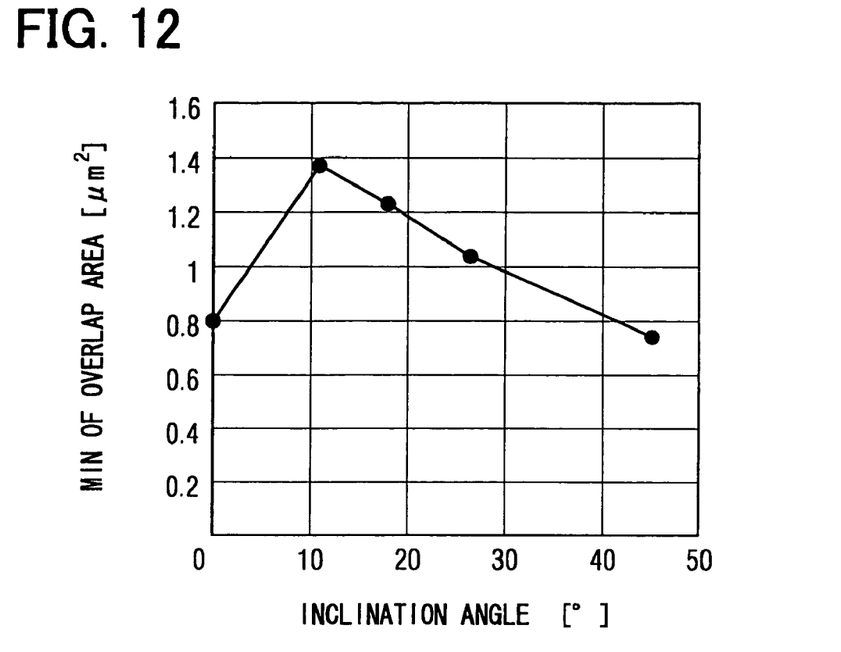
FIG. 12 is a diagram showing a relation between inclination angles of the trench gate electrodes and minimum values of the size of the overlap area at the inclination angles for the second embodiment.

FIG. 12 is a diagram showing a relation between the inclination angle of the trench gate electrode 42 and 5 min shown in FIG. 10 as the minimum size of overlaps areas common to the trench gate electrode 42 and the n-type column 24. In the diagram, the horizontal axis represents the inclination angle whereas the vertical axis represents 5 min.

As is obvious from the relation shown in FIG. 12, the minimum size of overlaps areas common to the trench gate electrode 42 and the n-type column 24 reaches a maximum value when the inclination angle of the trench gate electrode 42 is set at 11 degrees. Thus, by setting the trench gate electrode 42 at an inclination angle of about 11 degrees, the size of the overlap area that can be at least allocated is greater than that for other inclination angles even if the trench gate electrode 42 is shifted from the inclination angle of 11 degrees. As a result, an increase in channel resistance can be suppressed. Accordingly, the channel resistance can be kept in a range of values not exceeding a predetermined upper limit.

It is to be noted that, in the case of the second embodiment, an inclination angle with a small variation ratio of the size of the overlap area and an inclination angle with a minimum size of the overlap area are both an angle in close proximity to the inclination angle of 11 degrees. Thus, in the case of the second embodiment, by setting the trench gate electrode 42 at the inclination angle of about 11 degrees, it is possible to easily implement a layout position of the trench gate electrode 42 as a layout position providing both a small variation ratio of the channel resistance and a channel resistance in a range of values not exceeding a predetermined upper limit.

In addition, the relations shown in FIG. 10 also indicate that, at an inclination angle of 0 degrees and a shift distance of 0 microns, the size of the overlap area reaches a maximum value. Thus, in the case of the second embodiment, by setting the group of trench gate electrodes at an inclination angle of 0 degrees and a shift distance of 0 microns, the channel resistance can be reduced to a minimum value.

Third Embodiment

Figure 13:
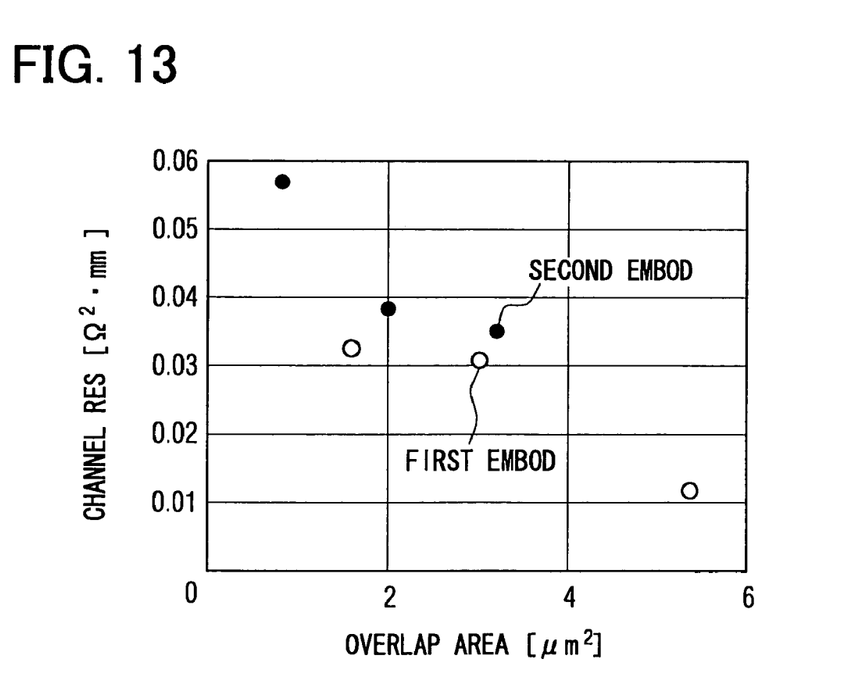
FIG. 13 is a diagram showing relations between sizes of an overlap area common to a trench gate electrode and an n-type column versus on-resistances.

A third embodiment is an implementation based on results of examining relations between the size of the overlap area and the channel resistance for the first and second embodiments. It is to be noted that these results are results for a 0-degree inclination angle of the trench gate electrode 42. FIG. 13 is a diagram showing relations between the size of the overlap area common to the trench gate electrode 42 and the n-type column 24 versus the channel resistance. In the diagram, the horizontal axis represents the size of the overlap area whereas the vertical area represents the channel resistance.

The relations shown in FIG. 13 indicate that the size of the overlap area common to the trench gate electrode 42 and the n-type column 24 is proportional to the channel resistance of the semiconductor device. That is, the variation ratio of the size of the overlap area common to the trench gate electrode 42 and the n-type column 24 is approximately equal to the variation ratio of the size of the overlap area. Thus, by increasing the size of the overlap area common to the trench gate electrode 42 and the n-type column 24, the channel resistance of the semiconductor device can be reduced and, when the variation ratio of the size of the overlap area common to the trench gate electrode 42 and the n-type column 24 is small, the variation ratio of the size of the overlap area is also small.

The embodiments of the present invention have been described above in detail. However, the embodiments are merely typical implementations of the present invention and do not limit the ranges of claims. Technologies described in the ranges of claims include a variety of changes and modifications of the embodiments described above.

In a process to fabricate an ordinary semiconductor device, in order to suppress a position alignment shift of a photo mask of trench gates, position alignment is carried out by using also an alignment mask on the semiconductor substrate in addition to an orientation flat. In accordance with the present invention, on the other hand, semiconductor devices having small dispersions of the channel resistance caused by a positional shift can be fabricated. Thus, the position alignment carried out by using the alignment mask can be eliminated. Since the fine position alignment carried out by using the alignment mask can be eliminated, the fabrication cost of the semiconductor device can be reduced.

In addition, technological elements explained in the specification and/or depicted in the figures are capable of demonstrating technological usability as individually independent elements or combinations of elements. The technological usability of the technological elements can be demonstrated by combining the elements into combinations not limited by those described in the claims. In addition, a plurality of objects described in the specification and/or illustrated in the figures can be achieved at the same time. Achievement of any one of the objects itself exhibits technological usability.

What is claimed is:

1. A vertical-type semiconductor device, comprising:
a repetitive-pattern layer on which second partial regions each having a second type of conduction and a hexagonal cross section are created by arranging the second partial regions repetitively in three directions separated from each other by an angle of 60 degrees over a face parallel to a principal face of the vertical-type semiconductor device and filling gaps among the second partial regions with a region having a first type of conduction;
a body layer in contact with the repetitive-pattern layer; and
a group of trench gate electrodes penetrating the body layer to reach the repetitive-pattern layer,
wherein:
the trench gate electrodes extend over a long distance upon the face parallel to the principal face and are arranged repetitively in a direction perpendicular to the longitudinal direction of the trench gate electrodes; and
the longitudinal direction of the trench gate electrodes is set in a range of angles from 4 degrees to 16 degrees relative to a side of the hexagonal cross section of each of the second partial regions.

2. A vertical-type semiconductor device, comprising:
a repetitive-pattern layer on which second partial regions each having a second type of conduction and a square cross section are created by arranging the second partial regions repetitively in two mutually perpendicular directions over a face parallel to a principal face of the vertical-type semiconductor device and filling gaps among the second partial regions with a region having a first type of conduction;
a body layer in contact with the repetitive-pattern layer; and
a group of trench gate electrodes penetrating the body layer to reach the repetitive-pattern layer,
wherein:
the trench gate electrodes extend over a long distance upon the face parallel to the principal face and are arranged repetitively in a direction perpendicular to the longitudinal direction of the trench gate electrodes; and
the longitudinal direction of the trench gate electrodes is set in a range of angles from 8 degrees to 29 degrees relative to a side of the square cross section of each of the second partial regions.

* * * * *